(12) United States Patent
Sagardoyburu

(10) Patent No.: US 9,761,643 B2
(45) Date of Patent: Sep. 12, 2017

(54) HYBRID DISPLAY ASSEMBLY INCLUDING A SOLAR CELL

(71) Applicant: The Swatch Group Research and Development Ltd., Marin (CH)

(72) Inventor: Michel Sagardoyburu, Neuchatel (CH)

(73) Assignee: The Swatch Group Research and Development Ltd, Marin (CH)

( * ) Notice: Subject to any disclaimer, the term of this patent is extended or adjusted under 35 U.S.C. 154(b) by 47 days.

(21) Appl. No.: 14/793,232

(22) Filed: Jul. 7, 2015

(65) Prior Publication Data
US 2016/0043149 A1 Feb. 11, 2016

(30) Foreign Application Priority Data
Aug. 7, 2014 (EP) .................................... 14180159

(51) Int. Cl.
| | | |
|---|---|---|
| H01L 27/32 | (2006.01) | |
| G02F 1/133 | (2006.01) | |
| G02F 1/1335 | (2006.01) | |
| G02F 1/1333 | (2006.01) | |
| G04C 10/02 | (2006.01) | |

(52) U.S. Cl.
CPC ........ *H01L 27/3232* (2013.01); *G02F 1/1333* (2013.01); *G02F 1/13306* (2013.01); *G02F 1/133528* (2013.01); *G02F 1/133553* (2013.01); *H01L 27/3227* (2013.01); *G02F 1/133536* (2013.01); *G02F 2001/13324* (2013.01); *G02F 2001/133541* (2013.01); *G02F 2201/44* (2013.01); *G04C 10/02* (2013.01); *Y02E 10/52* (2013.01)

(58) Field of Classification Search
None
See application file for complete search history.

(56) References Cited

U.S. PATENT DOCUMENTS

| | | | | |
|---|---|---|---|---|
| 6,169,708 | B1* | 1/2001 | Kaneko | G02F 1/133536 349/115 |
| 6,229,797 | B1* | 5/2001 | Cho | H04B 7/005 333/12 |
| 2006/0274218 | A1* | 12/2006 | Xue | G02F 1/133536 349/16 |
| 2011/0128264 | A1 | 6/2011 | Lee et al. | |
| 2013/0176518 | A1* | 7/2013 | Sampsell | G02B 26/001 349/58 |

OTHER PUBLICATIONS

European Search Report for EP Application No. 14 18 0159 dated Jan. 30, 2015.

* cited by examiner

*Primary Examiner* — Ashok Patel
(74) *Attorney, Agent, or Firm* — Sughrue Mion, PLLC

(57) ABSTRACT

Assembly for the display of at least one piece of information for a portable object, this display assembly (1) including a first, at least partially transparent, display device (2) which is located on the side of an observer (4) and arranged to display at least a first piece of information, a second, at least partially transparent, display device (6) for displaying at least a second piece of information and a solar cell (10) being disposed in that order underneath the first display device (2), the first and second display devices (2, 6) being capable of switching between an active state in which they display information and a passive state in which they do not display information.

13 Claims, 2 Drawing Sheets

HYBRID DISPLAY ASSEMBLY INCLUDING A SOLAR CELL

This application claims priority from European Patent Application No. 14180159.7 filed Jul. 8, 2014, the entire disclosure of which is incorporated herein by reference.

FIELD OF THE INVENTION

The present invention concerns a hybrid display assembly including a solar cell. More specifically, the present invention concerns such a display assembly including two superposed display devices underneath which is arranged a solar cell.

BACKGROUND OF THE INVENTION

The readability of the information displayed by digital display devices such as liquid crystal display cells is determined, in particular, by the surface area offered by the digital display device for displaying information. For a given display surface area, a compromise must therefore be found between the amount and size of information that is required to be displayed. The larger the size of the displayed information is, the better the readability of the information will be. However, the amount of information that it will be possible to display will necessarily be limited. Conversely, if the size of the displayed information is reduced, the amount of information can be increased, but this will be at the expense of readability.

To overcome this drawback, it has already been proposed to arrange a second display device underneath a first display device. Information can therefore be displayed partly with the first display device, and partly with the second display device. By switching between the first and second display device, it is possible to choose to reveal the information displayed by the first or second display device, which makes it possible to display a larger amount of information and in a larger size.

The drawback of such a display assembly including two superposed display devices is its electrical power consumption which is quite high. Such display assemblies are usually intended to be mounted in portable objects of small dimensions, such as wristwatches, whose power reserves are limited.

Further, the readability of the information displayed by display devices such as liquid crystal display cells or organic light emitting diode display devices is very dependent on ambient lighting conditions. With some display devices, the displayed information can be read in good conditions in a lit environment, but is difficult to read in a dark environment. Conversely, other categories of display devices provide a good quality display in twilight or darkness, but are difficult to read in broad daylight.

By way of example, let us consider transflective liquid crystal display cells, that is to say liquid crystal display cells capable of displaying information that will be visible in daytime by means of a reflection phenomenon, and which will also be visible at night by transmission by using a backlighting device. Such transflective liquid crystal display cells are optimised to provide the best possible reflection of sunlight and thus to ensure good readability of the displayed information in bright ambient conditions. However, in order for such transflective liquid crystal display cells to be capable of the best possible reflection of sunlight, their transmission efficiency is greatly restricted. Thus, when the backlighting device is activated to allow the displayed information to be read in twilight, most of the light emitted by the backlighting device is lost in absorption phenomena. Energy efficiency is therefore poor. Further, the optical qualities of the information displayed by the liquid crystal cell are greatly dependent on the viewing angle.

As regards emissive display devices, such as organic light-emitting diode display devices, these devices have superior optical qualities to those of liquid crystal display cells, since the optical qualities are not dependent on the viewing angle. Nonetheless, these high quality emissive display devices do not permit a reflective mode of operation. The information displayed thereby is thus very readable in twilight or darkness, but becomes difficult to read once observed outdoors. To overcome this problem, it is possible to increase the amount of current supplied to emissive display devices in order to ensure a minimum level of readability. However, even in normal conditions of use, these emissive display devices use more power than a reflective liquid crystal cell. Their electrical power consumption is such that it is difficult to envisage keeping them permanently on, in particular when they are incorporated in a portable object of small dimensions, such as a wristwatch, whose only source of energy is a battery which is usually required to last for more than one year.

SUMMARY OF THE INVENTION

It is thus an object of the present invention to overcome the aforementioned problems and others by providing a display assembly whose energy requirements can be satisfied even when it is incorporated in a portable object of small dimensions, such as a wristwatch, whose energy reserves are, however, limited. The present invention also provides a display assembly which operates in a satisfactory manner both in a well lit environment and in a dark environment.

To this end, the present invention concerns an assembly for the display of at least one piece of information for a portable object, this display assembly including a first, at least partially transparent, display device which is located on the side of an observer and arranged to display at least a first piece of information, a second, at least partially transparent, display device for displaying at least a second piece of information and a solar cell being disposed in that order underneath the first display device, the first and second display devices being capable of switching between an active state in which they display information and a passive state in which they do not display information.

As a result of these features, the present invention provides a display assembly including two superposed display devices, namely a first display device displaying a first piece of information, and a second display device displaying a second piece of information. It is therefore possible to display information partly with the first display device and partly with the second display device. By switching between the first and second display device, it is possible to choose to reveal the information displayed by the first or second display device, which makes it possible to display a larger amount of information and in a larger size. Further, by teaching that a solar cell is arranged underneath the two superposed display devices, the present invention allows integration of such an assembly in a portable object of small dimensions whose electrical energy reserves are necessarily limited. Indeed, it was observed that the amount of light that reached the solar cell through the set of two superposed display devices was sufficient to provide, by a phenomenon of photoelectric conversion, the amount of electrical energy necessary for operation of the two superposed display devices. Consequently, little or no demand is made on the electrical energy reserves of the portable object for operation of the two superposed display devices.

According to a complementary feature of the invention, the first display device located on the side of the observer is of the reflective type and the second display device disposed underneath the first display device is of the emissive type.

As a result of these other features, the present invention provides a display assembly for a portable object, such as a wristwatch, which operates in an optimum manner regardless of the ambient lighting conditions. In broad daylight, the information will preferably be displayed by the reflective display device. Indeed, this reflective display device, utilising a phenomenon of sunlight reflection to display information, is energy efficient. It can therefore remain permanently switched on and offers good readability of information in strong ambient lighting conditions. Conversely, in twilight or darkness, the information will preferably be displayed by the emissive display device. Such an emissive display device uses more current than a reflective display device, but the information displayed thereby is visible at night or in darkness with very good optical properties which are notably independent of the viewing angle.

According to a preferred embodiment of the invention, the first display device includes a reflective liquid crystal display cell, and the second display device includes a transparent, emissive organic light-emitting diode display cell.

BRIEF DESCRIPTION OF THE DRAWINGS

Other features and advantages of the present invention will appear more clearly from the following detailed description of one embodiment of the display assembly according to the invention, this example being given solely by way of non-limiting illustration with reference to the annexed drawing, in which.

DETAILED DESCRIPTION OF ONE EMBODIMENT OF THE INVENTION

The present invention proceeds from the general inventive idea that consists in arranging a solar cell underneath an assembly of two superposed display devices capable of switching between an active state in which they consume electrical energy to display information, and a passive state in which they do not use electrical energy and do not display any information. Owing to the use of two superposed display devices, it is possible to display information partly with the first display device, and partly with the second display device. By switching between the first and second display device, it is possible to choose to reveal the information displayed by the first or second display device, which makes it possible to display a larger amount of information and in a larger size. It was also realised that, by arranging a solar cell underneath the two superposed display devices, by the effect of photoelectric conversion, the solar cell provided an electrical current sufficient to allow operation of the two superposed display devices. It is therefore possible to integrate such a display assembly in a portable object of small dimensions, such as a wristwatch whose electrical energy storage capacity is, however, limited.

According to a complementary aspect of the invention, the first display device located on the side of the observer is of the reflective type, and the second display device disposed underneath the first display device is of the emissive type. The operation of the display assembly according to the invention is thus optimal regardless of the ambient lighting conditions. In broad daylight, the information will preferably be displayed by the reflective display device which uses a phenomenon of sunlight reflection to display information. Conversely, in twilight or darkness, the information will be displayed by the emissive display device which is capable of emitting light by consuming electrical energy.

Figure 1:
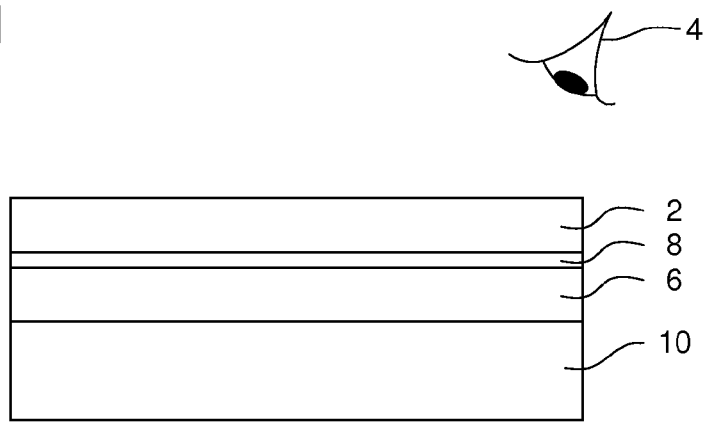
FIG. 1 is a schematic cross-section illustrating a display assembly according to the invention underneath which is arranged a solar cell.

FIG. 1 is a schematic cross-section of a display assembly according to the invention. Designated as a whole by the general reference numeral 1, this display assembly includes a first, at least partially transparent display device 2 arranged on the side of an observer 4, and a second, also at least partially transparent, display device 6, arranged underneath first display device 2.

Within the meaning of the present invention, the first and second display devices 2, 6 are display devices capable of switching between a state in which they consume electrical energy to display information, and a passive state in which they do not consume electrical energy and do not display any information.

Preferably, first display device 2 is bonded on second display device 6 by means of a transparent adhesive layer 8. This transparent adhesive layer 8 may be formed of an adhesive film or of a liquid acrylic or silicon adhesive. The purpose of this adhesive layer 8 is to prevent the problems of stray reflections which would occur if the two display devices 2, 6 were separated by an air layer and which would degrade the optical quality of display assembly 1 according to the invention.

Finally, a solar cell 10, capable of providing electrical energy by making use of the phenomenon of photoelectric conversion, is arranged underneath second display device 6.

Figure 2:
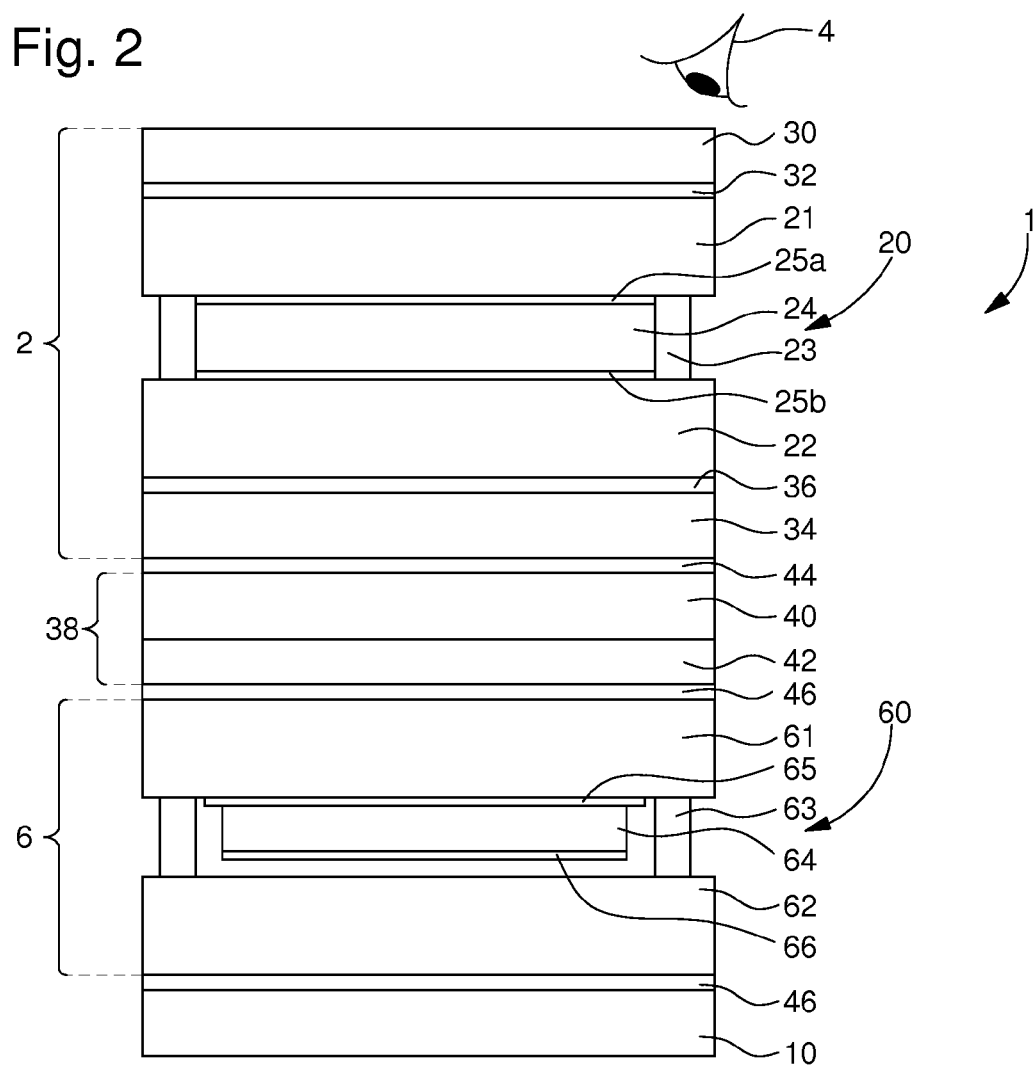
FIG. 2 is a cross-section of an example embodiment of a display assembly according to the invention wherein the first display device includes a reflective liquid crystal display cell and wherein the second display device includes a transparent, emissive, organic light-emitting diode display cell, a solar cell being arranged underneath this display assembly.

FIG. 2 is a detailed cross-sectional view of an example embodiment of display assembly 1 according to the invention, in the case where the first display device 2 includes a reflective liquid crystal display cell 20 and second display device 6 includes an emissive, transparent organic light emitting diode display cell 60, referred to hereafter as a TOLED display cell. Finally, solar cell 10 is disposed underneath this display assembly 1.

More specifically, reflective liquid crystal display cell 20 includes a front substrate 21 arranged on the side of observer 4 and a rear substrate 22 which extends parallel to and remote from front substrate 21. Front substrate 21 and rear substrate 22 are joined to each other by a sealing frame 23 which delimits a sealed volume 24 for containing a liquid crystal whose optical properties are modified by application of a suitable voltage at a particular crosspoint between transparent electrodes 25a arranged on a lower face of front substrate 21 and transparent counter electrodes 25b arranged on an upper face of rear substrate 22. Electrodes 25a and counter electrodes 25b are made of a transparent electrically conductive material such as indium-zinc oxide or indium-tin oxide (ITO).

In the case of the present invention, any of the liquid crystal phases, such as twisted nematic (TN), super twisted nematic (STN) or vertically aligned (VA), may be envisaged. Likewise, all addressing schemes, such as direct addressing, active matrix addressing, or passive matrix multiplexing addressing may be envisaged.

An absorbent polarizer 30 is bonded on an upper surface of front substrate 21 of reflective liquid crystal display cell 20 by means of an adhesive layer 32. This adhesive layer 32 may be formed of an adhesive film or of a liquid adhesive layer. The adhesive used to bond absorbent polarizer 30 on reflective liquid crystal display cell 20 may be transparent or slightly diffusing depending on whether specular or diffuse reflection is required. Absorbent polarizer 30 may be, for example, an iodine or dye type polarizer.

A reflective polarizer 34 is bonded on a lower face of rear substrate 22 of reflective liquid crystal display cell 20 by means of an adhesive layer 36 which may be transparent or slightly diffusing depending on whether specular or diffuse reflection is required. Reflective polarizer 34 may be of the wire grid polarizer type. It may also be a polarizer composed of a series of birefringent layers which cause polarization reflection or transmission by the effect of constructive or destructive interference, such as dual brightness enhancement film (DBEF) or APF polarizers, sold by the American company 3M®.

As will be seen below, reflective liquid crystal display cell 20 is, in a preferable, but not mandatory manner, bonded on transparent TOLED display cell 60 with the insertion of a circular polarizer 38. This TOLED display cell 60 includes a transparent substrate 61 made of glass or of a plastic material and an encapsulation cover 62 which extends parallel to and remote from transparent substrate 61. Transparent substrate 61 and encapsulation cover 62 are joined to each other by a sealing frame 63 which delimits a closed volume shielded from air and humidity to contain a stack of electroluminescent layers generally designated by the reference number 64. An upper transparent electrode 65, made for example of indium-tin oxide or ITO, and a lower transparent electrode 66, made for example using a metallic material such as aluminium or gold or a metallic oxide such as ITO or zinc-indium oxide, are structured on both sides of the stack of electroluminescent layers 64. These electrodes 65, 66, made of a metallic material, are slightly reflective. The transparent organic light emitting diode display cells are available either with direct addressing, in cases where they simply display icons or segments, or with passive matrix addressing in the case of a dot matrix display. In the case of a dot matrix display, it is also possible to use active matrix addressing combined with transparent thin film transistors (TFT) intended to control the current and which are arranged in display pixels located on the side of substrate 61 of transparent TOLED display cell 60.

Preferably, a circular polarizer 38 is arranged between reflective liquid crystal display cell 20 and transparent TOLED display cell 60. The purpose of this circular polarizer 38 is to improve the optical qualities of display assembly 1 by absorbing the stray reflections produced by transparent electrodes 65 and 66. It is, however, possible to do without this circular polarizer 38 if it is desired to save money or space. Circular polarizer 38 includes an absorbent linear polarizer 40 and a quarter-wave plate 42. On the side of reflective liquid crystal display cell 20, circular polarizer 38 is bonded on reflective polarizer 34 by means of a transparent adhesive layer 44, and on the side of transparent TOLED display cell 60, circular polarizer 38 is bonded on substrate 61 by means of a transparent adhesive layer 46. For reasons that will be explained in detail below, the axis of transmission of absorbent polarizer 40 is oriented parallel to the axis of transmission of reflective polarizer 34.

Finally, solar cell 10 is disposed underneath the stack formed by reflective liquid crystal display cell 20 and transparent TOLED display cell 60 on the side opposite observer 4. Preferably, solar cell 10 is bonded on the lower face of encapsulation cover 62 by means of a transparent adhesive layer 46.

With reference to FIGS. 3A to 3D the operating principles of display assembly 1 according to the invention will now be examined according to whether or not reflective liquid crystal display cell 20 and transparent TOLED display cell 60 are in use. It will be assumed, purely by way of non-limiting illustration, that reflective liquid crystal display cell 20 is a twisted nematic (TN) liquid crystal cell and that the axes of transmission of absorbent polarizer 30 and of reflective polarizer 34 are perpendicular.

Figure 3A:
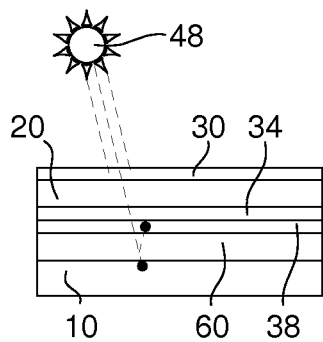
FIGS. 3A to 3D illustrate schematically the operating mode of the display assembly illustrated in FIG. 2 according to on whether the liquid crystal display cell and the organic light-emitting diode display cell are active or passive.

In FIG. 3A, reflective liquid crystal display cell 20 and transparent TOLED display cell 60 are both switched off. The ambient light, designated by the reference numeral 48, is linearly polarized by absorbent polarizer 30. Ambient light 48 then undergoes a 90° rotation when it passes through reflective liquid crystal display cell 20. Since the axis of transmission of reflective polarizer 34 extends in a direction perpendicular to the direction in which the axis of transmission of absorbent polarizer 30 extends, reflective polarizer 34 allows to pass without modification the ambient light 48 which escapes from reflective liquid crystal display cell 20. Ambient light 48 is then circularly polarized by circular polarizer 38 and transmitted without absorption by absorbent polarizer 40, whose axis of transmission is oriented parallel to the axis of transmission of reflective polarizer 34. Finally, ambient light 48 passes through transparent TOLED display cell 60. A small part of ambient light 48 is reflected on upper and lower transparent electrodes 65 and 66, so that the rotational direction of circular polarization of the light is reversed and so that it is absorbed when it passes through circular polarizer 38 again. As regards the remainder of ambient light 48, this passes through transparent TOLED display cell 60 without modification and is absorbed by solar cell 10 which has a dark or black appearance. Display assembly 1 thus appears black to observer 4.

Figure 3B:
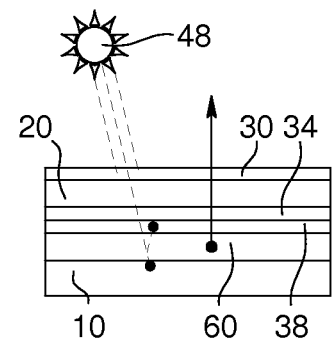

In FIG. 3B, reflective liquid crystal display cell 20 is deactivated, whereas transparent TOLED display cell 60 is activated. Ambient light 48, linearly polarized by absorbent polarizer 30, undergoes a 90° rotation when it passes through reflective liquid crystal display cell 20, and is then transmitted without modification by reflective polarizer 34. Ambient light 48 is then circularly polarized by circular polarizer 38, which transmits the light without absorption given that the axis of transmission of absorbent polarizer 40 is oriented parallel to the axis of transmission of reflective polarizer 34. Finally, ambient light 48 penetrates transparent TOLED display cell 60. A small fraction of ambient light 48 is then reflected by upper and lower transparent electrodes 65, 66 of transparent TOLED display cell 60. At the moment of reflection, the rotational direction of circular polarization of the light is reversed so that, when the light passes through circular polarizer 38 again it is absorbed by the latter. The rest of ambient light 48 is absorbed by solar cell 10. Moreover, half of the light emitted by transparent TOLED display cell 60 is absorbed by absorbent polarizer 40, whereas the other half of the light, which is linearly polarized, passes in succession through reflective polarizer 34, reflective liquid crystal display cell 20 and absorbent polarizer 30 without being absorbed. The displayed information therefore appears light on a dark background.

Figure 3C:
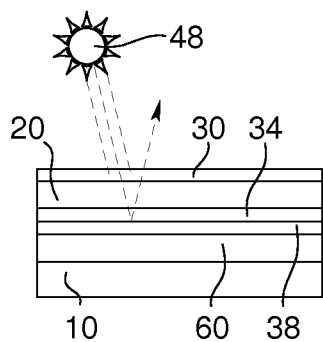

In FIG. 3C, reflective liquid crystal display cell 20 is activated, whereas transparent TOLED display cell 60 is switched off. In the areas of reflective liquid crystal display cell 20 which are not switched, ambient light 48, linearly polarized by absorbent polarizer 30, undergoes a 90° rotation when it passes through reflective liquid crystal display cell 20, and is then transmitted without modification by reflective polarizer 34. Ambient light 48 is then circularly polarized by circular polarizer 38, which transmits the light without absorption given that the axis of transmission of absorbent polarizer 40 is oriented parallel to the axis of transmission of reflective polarizer 34. Finally, ambient light 48 penetrates transparent TOLED display cell 60. A small fraction of ambient light 48 is reflected by upper and lower transparent electrodes 65 and 66. At that moment, the rotational direction of circular polarization is reversed so that, when the light passes through circular polarizer 38 again it is absorbed by the latter. The rest of ambient light 48 is absorbed by solar cell 10. Further, in the areas of reflective liquid crystal display cell 20 which are switched, ambient light 48 is transmitted without modification, so that the direction of polarization of ambient light 48 is perpendicular to the axis of transmission of reflective polarizer 34 and therefore parallel to the axis of reflection of said polarizer 34. Consequently, ambient light 48 is reflected by reflective polarizer 34 in the direction of reflective liquid crystal display cell 20. In the areas of reflective liquid crystal display cell 20 which are switched, the liquid crystal molecules do not modify the polarization direction of ambient light 48 when the latter passes through reflective liquid crystal display cell 20 again, so that ambient light 48 is not absorbed by absorbent polarizer 30 during its return travel, which makes the reflective mode of display assembly 1 possible.

Figure 3D:
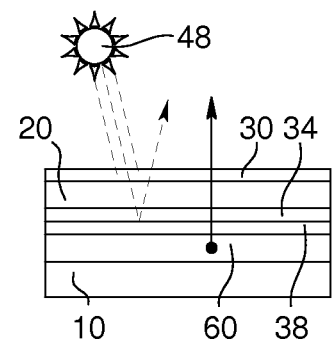

In FIG. 3D, reflective liquid crystal display cell 20 and transparent TOLED display cell 60 are both activated. In the areas of reflective liquid crystal display cell 20 that are switched, the fraction of ambient light 48 reflected by reflective polarizer 34 is not absorbed by absorbent polarizer 30 and is perceptible to observer 4, which allows reflective liquid crystal display cell 20 to display information in the reflective mode. The rest of the ambient light is absorbed by solar cell 10. Moreover, half of the light emitted by transparent TOLED display cell 60 is absorbed by circular polarizer 38, whereas the other half of the light emitted by transparent TOLED display cell 60 passes through circular polarizer 38, liquid crystal display cell 20 and absorbent polarizer 30 without being absorbed, so that it is perceptible to observer 4.

It goes without saying that this invention is not limited to the embodiments that have just been described and that various simple alterations and variants can be envisaged by those skilled in the art without departing from the scope of the invention as defined by the claims annexed to this Patent Application. It will be understood, in particular, that it is not strictly correct to say that ambient light passes without modification through the reflective liquid crystal display cell or the transparent TOLED display cell. In fact, when ambient light passes through these display cells, minimal stray light reflection phenomena always occurs. These stray reflections are, however, negligible within the scope of the present invention. It will also have been understood from the foregoing that it is also not strictly correct to speak of "transparent" electrodes. In fact, although made of a transparent, electrically conductive material, these electrodes are always very slightly reflective. The reflective liquid crystal display cell is selected from the group comprising twisted nematic liquid crystal display cells, super twisted nematic liquid crystal display cells and vertically aligned liquid crystal display cells. The reflective liquid crystal display cell may be a bistable display cell. By way of variant, the second display device includes a light-emitting display cell arranged to switch between an active state in which it emits light to display information and a passive state in which it does not emit any light.

LIST OF PARTS

Display assembly 1
First display device 2
Observer 4
Second display device 6
Adhesive layer 8
Solar cell 10
Reflective liquid crystal display cell 20
Front substrate 21
Rear substrate 22
Sealing frame 23
Sealed volume 24
Transparent electrodes 25a
Transparent counter electrodes 25b
Absorbent polarizer 30
Adhesive layer 32
Reflective polarizer 34
Adhesive layer 36
Circular polarizer 38
Absorbent linear polarizer 40
Quarter wave plate 42
Transparent adhesive layer 44
Transparent adhesive layer 46
Ambient light 48
TOLED display cell 60
Substrate 61
Encapsulation cover 62
Sealing frame 63
Stack of electroluminescent layers 64
Transparent upper electrode 65
Lower transparent electrode 66

What is claimed is:

1. An assembly for displaying at least one piece of information for a portable object, wherein the display assembly includes a first, at least partially transparent, display device which is located on the side of an observer and arranged to display at least a first piece of information, wherein a second, at least partially transparent, display device arranged to display at least a second piece of information and a solar cell are disposed in that order underneath the first display device, wherein the first and second display devices are configured to switch between an active state in which they display information and a passive state in which they do not display information, wherein the first display device located on the side of the observer is of the reflective type, and wherein the second display device disposed underneath the first display device is of the emissive type, wherein the first display device includes a reflective liquid crystal display cell arranged to switch between an active state in which the cell is reflective and displays information, and a passive state in which the cell is transparent and does not display any information, and wherein the second display device includes a light-emitting display cell arranged to switch between an active state in which the cell emits light to display information and a passive state in which the cell does not emit any light, and wherein the reflective liquid crystal display cell is selected from the group consisting of twisted nematic liquid crystal display cells, super twisted nematic liquid crystal display cells and vertically aligned liquid crystal display cells.

2. The display assembly according to claim 1, wherein the first display device is bonded on the second display device by means of an adhesive layer.

3. The display assembly according to claim 2, wherein the adhesive layer is formed of an adhesive film or a liquid adhesive layer.

4. The display assembly according to claim 1, wherein the reflective liquid crystal display cell (20) is bistable.

5. The display assembly according to claim 1, wherein the second display device includes a transparent organic light-emitting TOLED display cell arranged to switch between an active state in which the cell emits light to display information and a passive state in which the cell does not emit any light.

6. The display assembly according to claim 5, wherein the transparent TOLED display cell includes a stack of electroluminescent layers on either side of which are structured an upper transparent electrode and a lower transparent electrode.

7. The display assembly according to claim 1, wherein the reflective liquid crystal display cell is disposed between an absorbent polarizer located on the side of the observer and a reflective polarizer placed underneath the reflective liquid crystal display cell.

8. The display assembly according to claim 7, wherein a circular polarizer is disposed between the reflective liquid crystal display cell and the second display device.

9. The display assembly according to claim 8, wherein the circular polarizer includes an absorbent linear polarizer and a quarter-wave plate.

10. The display assembly according to claim 9, wherein the absorbent linear polarizer has an axis of transmission which is parallel to an axis of transmission of the reflective polarizer.

11. The display assembly according to claim 10, wherein the second display device includes a transparent organic light-emitting TOLED display cell arranged to switch between an active state in which the cell emits light to display information and a passive state in which the cell does not emit any light.

12. The display assembly according to claim 7, wherein the second display device includes a transparent organic light-emitting TOLED display cell arranged to switch between an active state in which the cell emits light to display information and a passive state in which the cell does not emit any light.

13. The display assembly according to claim 8, wherein the second display device includes a transparent organic light-emitting TOLED display cell arranged to switch between an active state in which the cell emits light to display information and a passive state in which the cell does not emit any light.

* * * * *

UNITED STATES PATENT AND TRADEMARK OFFICE
CERTIFICATE OF CORRECTION

PATENT NO. : 9,761,643 B2
APPLICATION NO. : 14/793232
DATED : September 12, 2017
INVENTOR(S) : Michel Sagardoyburu Page 1 of 1

It is certified that error appears in the above-identified patent and that said Letters Patent is hereby corrected as shown below:

On the Title Page

Column 1, (73) Assignee:
"Ltd,"
Has been replaced with:
--Ltd.,--

Column 1, (30) Foreign Application Priority Data:
"14180159"
Has been replaced with:
--14180159.7--

Signed and Sealed this
Twenty-eighth Day of August, 2018

Andrei Iancu
*Director of the United States Patent and Trademark Office*